United States Patent [19]

Simanyi et al.

[11] Patent Number: 4,734,300

[45] Date of Patent: Mar. 29, 1988

[54] METHODS FOR REMOVING PARYLENE COATINGS FROM PREDETERMINED, DESIRED AREAS OF A SUBSTRATE

[75] Inventors: Lydia H. Simanyi, Santa Ana; Robert A. Dunaetz, Manhattan Beach; Steven R. Felstein, Redondo Beach; Rebecca Lee, Los Angeles; Joan L. Lum, Redondo Beach, all of Calif.

[73] Assignee: Hughes Aircraft Company, Los Angeles, Calif.

[21] Appl. No.: 840,286

[22] Filed: Mar. 14, 1986

[51] Int. Cl.$^4$ ............................ B05D 3/10; B05D 3/12
[52] U.S. Cl. ...................................... 427/444; 134/42; 252/164; 252/170; 427/99; 427/273; 427/277
[58] Field of Search ................. 427/273, 336, 444, 99, 427/277; 252/164, 170; 134/38, 25.4, 40, 42

[56] References Cited

U.S. PATENT DOCUMENTS

| | | | |
|---|---|---|---|
| 3,625,763 | 12/1971 | Melillo | 134/38 |
| 3,762,953 | 10/1973 | Clarke, Jr. et al. | 134/38 |
| 3,840,387 | 10/1974 | Hofer | 427/99 |
| 4,116,715 | 9/1978 | Smiggen et al. | 134/38 X |

Primary Examiner—Evan K. Lawrence
Attorney, Agent, or Firm—M. E. Lachman; A. W. Karambelas

[57] ABSTRACT

Predetermined desired areas of solvent-insoluble parylene coatings are removed from substrates made of materials such as plastics, metals, composites, or ceramics by contacting the areas to be removed with a substance that causes the parylene coating to loosen from the substrate sufficiently to permit physical removal, as by peeling or scraping. The substance used is tetrahydrofuran alone, or in combination with a carrier that does not react with the tetrahydrofuran, the parylene, or the substrate, and that makes the mixture sufficiently viscous for application to desired coating areas without affecting other areas contiguous thereto.

6 Claims, No Drawings

METHODS FOR REMOVING PARYLENE COATINGS FROM PREDETERMINED, DESIRED AREAS OF A SUBSTRATE

BACKGROUND OF THE INVENTION

1. Field of the Invention

This invention relates to methods for removing solvent-insoluble tives of para-xylylene from predetermined, desired areas of substrates carrying such coatings, and to compositions for use in such methods.

2. Discussion of Background Art

In the fabrication of electronics assemblies such as printed circuit boards and ceramic circuit boards, a popular and frequently used coating for the circuit boards, for components on the boards, and for connectors and leads linking elements on the boards to one another and to devices not directly attached to the boards has been vacuum vapor-phase-deposited, polymerized paraxylylene and vacuum vapor-phase-deposited, polymerized substituted derivatives of para-xylylene such as poly-para-xylylene itself, sometimes called parylene N, poly-monochloro-para-xylylene, commonly called parylene C, and poly-dichloro-para-xylylene, commonly called parylene D. These parylenes, and particularly parylene C, are among the best conformal coatings for electronics, for they impart good water impermeability, high resistance to solvents, high resistance to heat, and excellent coefficients of thermal expansion. Moreover, they are normally deposited in such thin layers that the electrical properties of electronic devices are unaffected by their presence. However, these coatings are exceedingly difficult to remove, for most parylenes are insoluble in common solvents.

Efforts to abrade parylene coatings from electronics components, printed circuit boards and flex harnesses have proved ineffective. Abrasion tends to damage the coated electronic assemblies and adjacent parts, generates dirt and dust that are difficult to remove, and is difficult to confine to a precise area where the coating is desired to be removed without affecting contiguous coating areas. Other methods of removing parylene, such as plasma etching, are time consuming, costly, and often result in broken or damaged components and substrates.

For some time, a need has existed for a simple, cost-effective method, suitable for field use, for removing parylene coatings from substrates, particularly substrates such as printed wiring boards, ceramic circuit boards, and electronic circuits that are densely packed with parylene-coated components and leads. Such methods must remove the coatings from desired, predetermined areas without affecting contiguous or adjacent components whether coated or uncoated.

SUMMARY OF THE INVENTION

This invention provides methods for removing from substrates such as printed wiring boards, electronic components, flex harnesses, ceramic, metal, and other substrates, predetermined, desired areas of parylene coating without damaging the substrate, and without removing the parylene coatings from other areas contiguous to the area desired to be removed. The substrates to be treated in accordance with the methods of this invention carry coatings comprising at least one member selected from the group consisting of solvent-insoluble vacuum vapor-phase-deposited, polymerized para-xylylene, and solvent-insoluble vacuum and vapor-phase-deposited, polymerized, substituted derivatives of para-xylylene such as monochloro-para-xylylene and dichloro-para-xylylene.

The methods for removing these parylene coatings from substrates carrying them comprise contacting the predetermined, desired coated areas to be removed with a substance that causes these areas to loosen from the substrate sufficiently to permit physical removal, as by peeling or scraping. The preferred substance is tetrahydrofuran, applied alone, or applied in combination with a carrier such as colloidal silica. The carrier is preferably inert, meaning that it does not react either with tetrahydrofuran, the parylene coating, or any of the electronic components and substrates carrying the parylene coating. The inert carrier acts as a thickener, as well as a carrier, permitting application of the carrier/tetrahydrofuran mixture to precise, predetermined, desired areas coated with parylene without affecting contiguous components, whether coated or uncoated.

DETAILED DESCRIPTION OF THE INVENTION

The methods of this invention will remove solvent-insoluble parylene coatings from substrates made of metal, plastic, composite or ceramic material, including such metals as aluminum, steel, gold, tin, lead and silver, or mixtures thereof, such plastics as diallyl phthalate, nylon or polyimide, such composites as laminated printed wiring board materials consisting of epoxy/glass, polyimide/glass, or polyimide/acrylic, and such ceramics as alumina and beryllia. The methods of this invention remove parylene coatings of widely varying thicknesses, and in preferred embodiments will remove coatings having thicknesses in the range of about 0.10 mil ($2.54 \times 10^{-4}$ cm) to about 15 mils ($3.8 \times 10^{-2}$ cm). The parylene coatings that these methods remove are applied by conventional vapor-phase deposition/polymerization methods.

The substances used in accordance with the methods of this invention to remove parylene coatings from substrates cause predetermined, desired areas of the parylene coating to loosen from the substrate sufficiently to permit physical removal of the coating by such methods as peeling and scraping. These substances do not react chemically with the parylene-coated areas or with the substrates carrying the parylene coating, but rather penetrate the coating and loosen the bond between the coating and the substrate to cause sufficient loosening to permit removal of the parylene coatings within a short period of time, in preferred embodiments, less than 30 minutes after application to the areas to be removed. These substances are, in preferred embodiments, applied at room temperature, but can be appied at any temperature in the range of about $-40°$ F. ($-40°$ C.) to about 115° F. (about 46° C.), in an amount sufficient to loosen the coating sufficiently to permit its removal readily by physical methods.

In preferred embodiments, the substance applied to the parylene coatings to loosen them from their substrates is tetrahydrofuran, used alone, or in combination with an inert carrier such as Cab-O-Sil (a fumed or colloidal silica manufactured by Cabot Corporation) or alumina. These carriers are inert, meaning that they do not react with tetrahydrofuran or with parylene, or with the substrates carrying the parylene coatings. The carrier acts as a thickener and, combined with tetrahydrofuran, forms a viscous substance that can be applied to predetermined, desired parylene-coated areas to remove the coating from those areas without affecting contiguous or adjacent areas whether coated or uncoated. Preferably, the tetrahydrofuran is combined with an inert carrier in a weight ratio of tetrahydrofuran to carrier in the range of about 1:40 to about 1:25. The mixing of the carrier and tetrahydrofuran can be effected easily and rapidly by simply mixing the two with one another in a beaker, vat or other container preferably undre a hood. A preferred mixture comprises about 4.5 to about 5 grams of Cab-O-Sil to 100 ml of tetrahydrofuran. Since tetrahydrofuran is a volatile liquid, the mixture of tetrahydrofuran and carrier is preferably kept in a sealed container. When the mixture is applied to the structure to be treated, such as a connector, either the structure with the mixture coated thereon may be placed in a sealed container, or aluminum foil or other protective material may be wrapped around the structure to prevent evaporation of the tetrahydrofuran. If drafty conditions exist, it may be desirable to add more liquid tetrahydrofuran to the mixture to prevent caking or cracking of the mixture.

In preferred embodiments, the tetrahydrofuran alone, or in combination with an inert carrier, is maintained in contact with the coating area desired to be removed for a time in the range of about 15 to about 30 minutes. Thereafter, if liquid tetrahydrofuran was used, the coated area is preferably set aside to dry for a period of 5 to 60 minutes. If any tetrahydrofuran remains on the coated area, it can be removed by rinsing with alcohol, acetone, water, or other common solvent. If the tetrahydrofuran/inert carrier mixture was used, it can be removed by rinsing with water and brushing, followed by a solvent rinse. Thereafter, within a period of a few minutes up to several hours, the parylene coating can be physically removed, as by pulling with tweezers, scraping or prying off with a chisel-like tool made of a material such as plastic, composite or wood, or abrading with an eraser. The speed of removal of the parylene coating depends on the thickness of the coating, with thicker coatings being more readily removed.

The tetrahydrofuran used in the methods of the present invention has been found to be compatible with a variety of materials which are commonly used to fabricate electronics assemblies. The following substrate materials were exposed to tetrahydrofuran for periods of time varying from 15 minutes to five hours: nylon, diallyl phthalate, polyimide-fortified epoxy adhesive, flexible polyimide/acrylic laminated sheet, epoxy/glass composites, polyimide/glass composites, alumina, solder, ceramics and aluminum. Scanning electron photomicrograms at various magnifications from 20X to 5000X revealed no significant changes in the surface appearance of the substrates. In addition, Fourier Transform Infrared Analysis (FTIR) of each sample revealed that the spectra of the material after exposure to tetrahydrofuran was the same as the spectra of the material before exposure.

While tetrahydrofuran is the preferred material for practicing the method of the present invention, it has also been found that certain other substances may be used. Dichloromethane (or methylene chloride) may be used in place of tetrahydrofuran although the former needs a 15 to 20 times longer exposure period to loosen the parylene than the latter. Alternatively, toluene may be used, but requires an exposure period 50 times longer than that for tetrahydrofuran. By contrast, acetone, 1,1,1-trichloroethane and alcohol were found to have no loosening or other effect on the parylene coating.

These methods and compositions have many advantages. The methods permit removal of parylene without special instruments or tools, facilitating removal in field locations and other places away from manufacturing and reworking facilities. Parylene can be removed from densely packed electronic assemblies and closely spaced connector pins, from complicated assemblies having protruding circuits, soldered inter-connecting protrusions, plated through-holes, and tall components. Parylene can be removed from printed wiring boards with unusually closely-spaced components without damaging the components and without harming adjacent components.

These methods also permit removal of parylene from very thin circuits and fragile components with extremely thin leads without damaging them, and do so quickly and efficiently, reducing the cost of reworking the circuitry. Moreover, these methods do not damage metal substrates, plastic substrates, or composite or ceramic components or substrates.

EXAMPLES

The method of the present invention as described herein was used to remove coatings of parylene C from connector pins assembled in a connector structure. Gold-plated round connector pins were held in a glass-filled diallyl phthalate substrate. Gold-plated rectangular pins were held in a nylon substrate which interfaced with a laminated polyimide/acrylic flexible cable. The parylene coating was approximately 0.4 mil ($1.02 \times 10^{-3}$ cm) thick.

A parylene coating was removed from gold-plated pins in a connector assembly using the preferred mixture of tetrahydrofuran (obtained from Allied Corporation) and Cab-O-Sil (obtained from Cabot Corporation), as previously described herein. After treatment with the mixture for one hour, during which the exposed areas were covered with aluminum foil to prevent evaporation, the parylene coating was pulled off the connectors with tweezers under a magnifying glass. For round pins, the coating was removed from 10 pins in 10 minutes in one case, and 2.3 minutes in another case. For rectangular pins treated with the mixture for two hours, the coating was removed from 10 pins in less than three minutes. The pins were examined under a microscope and found to be free of the parylene coating and undamaged by the treatment process.

A parylene coating was removed from gold-plated pins in a connector assembly using tetrahydrofuran alone as described herein. For round pins, after a one-hour treatment with tetrahydrofuran, the coating was removed from 10 pins in 25 minutes. For rectangular pins, after treatment with tetrahydrofuran for 0.25 to 1.25 hours, the coating was removed at a rate varying from 0.15 to 0.75 minutes per pin for connectors with 10 to 41 pins. The pins were examined under a microscope and found to be free of the parylene coating and undamaged by the treatment process.

From these tests, it was concluded that the period of time for treating the parylene coating with tetrahydrofuran did not affect the speed of physical removal of the loosened coating. The same rate of removal was achieved for a sample treated for 15 minutes as for one treated for one hour.

Additional tests showed that very thin coatings, e.g., 0.2 mil ($0.51 \times 10^{-3}$ cm) thick of parylene can be removed from connectors as described above although the physical removal of the loosened parylene is more tedious for a thin coating than for a thicker one. In addition to using tweezers, a scraping wedge of epoxy/glass composite was used. Alternatively, an eraser may be used as an abrading tool to remove the loosened, thin parylene coating. Particular erasers which are satisfactory for this purpose are "Parapink" (a trademark of Eraser Stick) and "Plash Race" (a trademark of Eberhard Faber).

The method of the present invention using the tetrahydrofuran mixture was also used to remove a parylene coating from a defined area of a printed wiring board. After treatment with the tetrahydrofuran mixture, a 4-inch (10.16 cm) square epoxy/glass composite area without plated-through holes was stripped of 0.5 mil ($1.27 \times 10^{-3}$ cm) parylene in one to three minutes. Examination of the treated structure under a microscope at 20X magnification revealed removal of the parylene without damage to the printed wiring board, including the markings thereon. After similar treatment a 6.25-inch (15.88 cm) square epoxy/glass composite area with 14 plated-through holes required 12 minutes for removal of parylene from the composite surface as well as the plated-through holes. In the case of the latter, the parylene in each hole was removed in a single cylinder-shaped piece. Total removal from the surface and holes was verified at 20X magnification.

The preceding description has presented in detail exemplary preferred ways in which the concepts of the present invention may be applied. Those skilled in the art will recognize that numerous alternatives encompassing many variations may readily be employed without departing from the scope of the invention. In particular, the present invention is not limited to the use of tetrahydrofuran, but rather is intended to include any substance which is capable of loosening the solvent-insoluble paraylene coating from the substrate to an extent sufficient to permit physical removal of the loosened coating from the substrate. In particular, it is anticipated that cyclic ethers, aromatic ethers, halogenated alkanes, halogenated aromatics or alkylated aryl compounds will be effective for this purpose.

What is claimed is:

1. A method for removing at least one predetermined, desired area of a coating from a substrate having said coating thereon, said coating comprising at least one member selected from the group consisting of solvent-insoluble vacuum vapor-phase-deposited, polymerized para-xylylene and solvent-insoluble vacuum vapor-phase-deposited, polymerized, substituted derivatives of para-xylylene, said method comprising contacting said at least one area of the coating to be removed with a substance selected from the group consisting of tetrahydrofuran, dichloromethane, and toluene to loosen the coating on said area sufficiently to permit removal of said area of said coating by physical means.

2. The method of claim 1 wherein said coating comprises poly-monochloro-para-xylylene and said substance comprises tetrahydrofuran.

3. The method of claim 1 wherein said substance is mixed with an inert carrier to form a mixture having a viscosity sufficient to permit application of the substance to a confined coating area with substantially no leakage or drainage of said substance to contiguous areas under the temperature and pressure conditions of application.

4. the method of claim 1 wherein said substrate is selected from the group consisting of a printed wiring board, an electronic circuit, and an electronic component.

5. The method of claim 3 wherein said inert carrier is selected from the group consisting of colloidal silica and alumina.

6. The method of claim 3 wherein said substance comprises tetrahydrofuran and the ratio of said tetrahydrofuran to said inert carrier is in the range of about 1:40 to about 1:25.

* * * * *

UNITED STATES PATENT AND TRADEMARK OFFICE
CERTIFICATE OF CORRECTION

PATENT NO. : 4,734,300
DATED : Mar. 29, 1988
INVENTOR(S) : SIMANYI ET AL

It is certified that error appears in the above—identified patent and that said Letters Patent is hereby corrected as shown below:

Col. 1, line 9, delete "tives" and insert therefor --vapor-phase deposited, polymerized para-xylylene and vapor-phase deposited, polymerized, substituted derivatives--.

Col. 2, line 54, delete "appied" and insert therefor --applied--.

Col. 3, line 10, delete "undre" and insert therefor --under--.

Col. 6, line 14, after "substance" insert --comprising a material--.

Col. 6, line 28, delete "the" and insert therefor --The--.

Signed and Sealed this

Fourth Day of October, 1988

Attest:

DONALD J. QUIGG

*Attesting Officer*  *Commissioner of Patents and Trademarks*